(12) United States Patent
Bae et al.

(10) Patent No.: US 10,008,554 B2
(45) Date of Patent: Jun. 26, 2018

(54) DISPLAY APPARATUS

(71) Applicant: Samsung Display Co., Ltd., Yongin-si, Gyeonggi-do (KR)

(72) Inventors: Woomi Bae, Daegu-si (KR); Hui Nam, Yongin-si (KR); Myoungseop Song, Asan-si (KR); Myungho Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/176,049

(22) Filed: Jun. 7, 2016

(65) Prior Publication Data

US 2017/0092703 A1 Mar. 30, 2017

(30) Foreign Application Priority Data

Sep. 30, 2015 (KR) .................. 10-2015-0138133

(51) Int. Cl.
| | | |
|---|---|---|
| H01L 27/32 | (2006.01) | |
| G02F 1/1335 | (2006.01) | |
| G02F 1/1343 | (2006.01) | |
| G02F 1/1368 | (2006.01) | |
| G02F 1/13 | (2006.01) | |
| H01L 51/52 | (2006.01) | |
| H01L 27/12 | (2006.01) | |
| H01L 51/00 | (2006.01) | |

(52) U.S. Cl.
CPC ........ *H01L 27/3232* (2013.01); *G02F 1/1323* (2013.01); *G02F 1/1368* (2013.01); *G02F 1/13439* (2013.01); *G02F 1/133528* (2013.01); *G02F 1/134309* (2013.01); *H01L 51/5275* (2013.01); *H01L 27/1214* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 2008/0303976 | A1* | 12/2008 | Nishizawa | ........ G02F 1/133305 349/64 |
| 2009/0161048 | A1* | 6/2009 | Satake | .............. G02F 1/133305 349/110 |
| 2009/0201443 | A1* | 8/2009 | Sasaki | ................... G02F 1/1333 349/70 |
| 2009/0316062 | A1* | 12/2009 | Nishizawa | ........ G02F 1/133305 349/58 |
| 2010/0073593 | A1* | 3/2010 | Sasaki | ................... B29D 11/00 349/58 |

(Continued)

FOREIGN PATENT DOCUMENTS

| | | | |
|---|---|---|---|
| KR | 10-2007-0027500 A | 3/2007 | |
| KR | 10-2013-0048622 A | 5/2013 | |

(Continued)

*Primary Examiner* — Lex Malsawma
(74) *Attorney, Agent, or Firm* — Lewis Roca Rothgerber Christie LLP

(57) ABSTRACT

A display apparatus includes a display apparatus includes a display panel including a curved display area, and an optical unit including a liquid crystal layer on the curved display area, and configured to adjust a direction of light emitted from the display panel.

16 Claims, 10 Drawing Sheets

(56) References Cited

U.S. PATENT DOCUMENTS

| | | | | |
|---|---|---|---|---|
| 2010/0164860 | A1* | 7/2010 | Misono | F21V 5/00 345/102 |
| 2010/0195040 | A1* | 8/2010 | Koganezawa | G02F 1/1333 349/153 |
| 2011/0102721 | A1* | 5/2011 | Enomoto | G02F 1/133536 349/137 |
| 2013/0321740 | A1* | 12/2013 | An | H05K 5/0217 349/58 |
| 2015/0116625 | A1* | 4/2015 | Hwang | G02F 1/136209 349/57 |
| 2015/0212549 | A1* | 7/2015 | Shin | G02F 1/133308 361/679.26 |
| 2015/0378193 | A1* | 12/2015 | Song | G02F 1/133528 349/96 |

FOREIGN PATENT DOCUMENTS

| | | |
|---|---|---|
| KR | 10-2014-0004100 A | 1/2014 |
| KR | 10-2014-0089767 A | 7/2014 |
| KR | 10-2014-0107063 A | 9/2014 |
| KR | 10-2015-0026427 A | 3/2015 |
| KR | 10-2015-0039123 A | 4/2015 |
| KR | 10-2015-0045135 A | 4/2015 |

\* cited by examiner

DISPLAY APPARATUS

CROSS-REFERENCE TO RELATED APPLICATION

This application claims priority to, and the benefit of, Korean Patent Application No. 10-2015-0138133, filed on Sep. 30, 2015, in the Korean Intellectual Property Office, the disclosure of which is incorporated herein in its entirety by reference.

BACKGROUND

1. Field

Embodiments of the present disclosure herein relates to a display apparatus having a curved display area.

2. Description of the Related Art

Organic light emitting display apparatuses have organic light emitting diodes and pixel circuits, which are disposed in each pixel area on a substrate, and are able to display images using the light emitted from the plurality of organic light emitting diodes. Organic light emitting display apparatuses may be self-luminescent, and thus may have reduced thicknesses and weight, because backlights are not required, unlike liquid crystal display apparatuses.

Organic light emitting display apparatuses may be curved when polymer films are used as substrates thereof. Such flexible organic light emitting display apparatuses may include curved portions, and may be designed to have various shapes, such as a combined shape including a flat portion and a curved portion, or such as a shape in which a plurality of curved portions are continuously connected.

SUMMARY

Embodiments of the present disclosure provide a display apparatus for preventing deterioration in display quality.

An embodiment of the inventive concept provides a display apparatus includes a display panel including a curved display area, and an optical unit including a liquid crystal layer on the curved display area, and configured to adjust a direction of light emitted from the display panel.

The optical unit may further include a plurality of lower electrodes at the curved display area, thin film transistors on the display panel, and respectively electrically connected to the lower electrodes, a first substrate facing the display panel with the liquid crystal layer therebetween, and an upper electrode on the first substrate and facing the lower electrodes.

The optical unit may further include a second substrate coupled to the display panel between the first substrate and the display panel, the liquid crystal layer may be between the first and second substrates, and the lower electrodes may be on the second substrate.

The display panel may include an organic light emitting display panel.

A window may be over the optical unit.

A polarizing plate may be between the optical unit and the window.

The curved display area may include a plurality of curved display areas, and the optical unit may include a plurality of optical units, the optical units may respectively overlap the curved display areas in one-to-one correspondence.

An air gap may be between the optical units.

A transparent polymer layer may be in the air gap.

The display panel may further include a flat display area, and the transparent polymer layer may overlap the flat display area of the display panel.

The optical unit may further include a first substrate facing the display panel, an upper electrode under the first substrate, a lower electrode facing the upper electrode with the liquid crystal layer therebetween at the curved display area, and may include a size corresponding to the upper electrode, a thin film transistor at the curved display area, and electrically connected to the lower electrode; and an optical pattern on the lower electrode, and configured to guide the direction of the light emitted from the display panel.

The optical unit may further include a second substrate on the display panel and may face the first substrate with the liquid crystal layer therebetween, and the lower electrode may be on the second substrate.

The optical pattern may include differently shaped prism parts.

Each of the prism parts may include a triangular shape when viewed in a cross-section.

The curved display area may be at one side of the display panel, each of the prism parts may include an optical surface inclined toward the one side of the display panel, and a size of an inclination angle between the optical surface and the second substrate may increase with proximity of respective ones of the prism parts to the one side of the display panel.

Each of the prism parts may include a shape of a right-angled triangle when viewed in a cross-section.

A detection unit electrically may be connected to the optical unit, and may be configured to detect the user's viewing direction, the optical unit may be configured to be operated when a viewing direction detected from the detection unit may include a direction toward the front of the user.

BRIEF DESCRIPTION OF THE DRAWINGS

The accompanying drawings are included to provide a further understanding of the inventive concept, and are incorporated in, and constitute a part of, this specification. The drawings illustrate exemplary embodiments of the inventive concept and, together with the description, serve to explain principles of the inventive concept. In the drawings.

DETAILED DESCRIPTION

Figure 1:
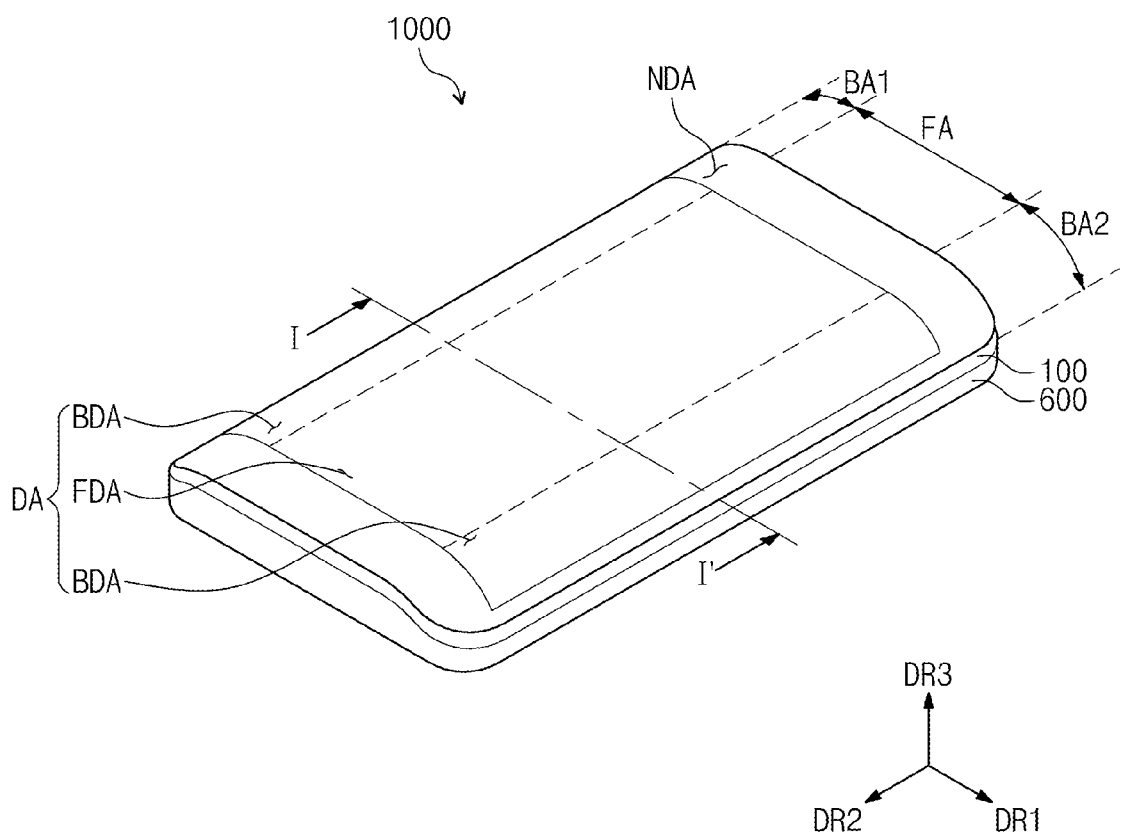
FIG. 1 is a perspective view illustrating a display apparatus according to embodiments of the inventive concept.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, exemplary embodiments will be described in detail with reference to the accompanying drawings.

FIG. 1 is a perspective view illustrating a display apparatus according to embodiments of the inventive concept.

FIG. 1 illustrates a mobile terminal as a non-limiting example, in which a display apparatus 1000 according to an embodiment of the inventive concept may be applied. Mobile terminals may include tablet PCs, smart phones, personal digital assistants (PDAs), portable multimedia players (PMPs), game consoles, wrist watch electronic apparatuses, and the like. However, the inventive concept is not limited to a specific kind of the display apparatus 1000. For example, in another embodiment of the inventive concept, the display apparatus 1000 may be used for a large-sized electronic device, such as an outdoor advertising panel, and for small and medium size electronic apparatuses, such as personal computers, laptop computers, vehicle navigation apparatus, and cameras.

Referring to FIG. 1, the display apparatus 1000 according to embodiments of the inventive concept may include a plurality of separate regions on a display surface. The display apparatus 1000 may include a display area DA, on which an image is displayed, and a non-display area NDA adjacent the display area DA. The display area DA may have a rectangular shape. The non-display area NDA may be configured to surround the display area DA.

The display apparatus 1000 may be shaped to be partially curved. The display apparatus 1000 may include a flat area FA, and curved areas BA1 and BA2 that are connected to the flat area FA.

The flat area FA may be substantially parallel to a surface, or plane, defined by a first direction DR1 and a second direction DR2, and the normal direction of the flat area FA is substantially parallel to a third direction DR3. The third direction DR3 is a reference direction for distinguishing front and rear surfaces of each of the members that will be described later.

In embodiments of the inventive concept, the curved areas BA1 and BA2 may include a first curved area BA1 and a second curved area BA2. The first and second curved areas BA1 and BA2 may face each other with the flat area FA therebetween. That is, the first curved area BA1 is at one side of the display apparatus 1000 with respect to the first direction DR1, and the second curved area BA2 may be at the other side of the display apparatus 1000 in the first direction DR1.

Each of the first and second curved areas BA1 and BA2 may have a surface that is curved with reference to the first direction DR1 when viewed in a plane, and may extend parallel to (e.g., may be uncurved with respect to) the second direction DR2. FIG. 1 illustrates two curved areas BA1 and BA2, but the embodiments of the inventive concept are not limited to the number of curved areas BA1 and BA2. As a non-limiting example, the display apparatus 1000 may include only one of the first and second curved areas BA1 and BA2 to the exclusion of the other.

One portion of the display area DA is defined in the flat area FA, and the other portion of the display area DA is defined in the curved areas BA1 and BA2. The one portion of the display area DA in the flat area FA may be referred to as a flat display area FDA, and the other portion of the display area DA defined in the curved areas BA1 and BA2 may be referred to as a curved display area BDA.

Figure 2A:
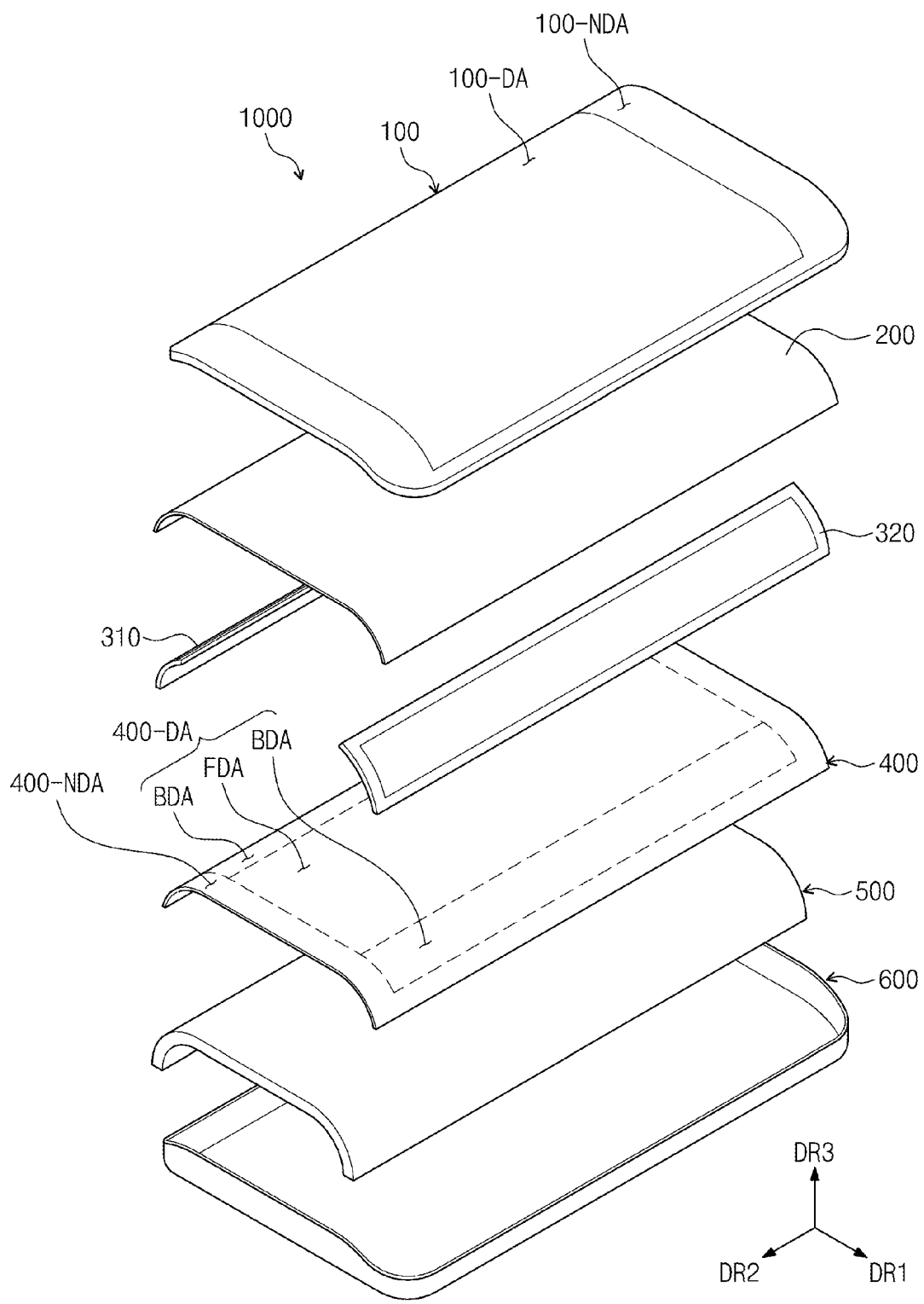
FIG. 2A is an exploded perspective view of the display apparatus illustrated in FIG. 1.
Figure 2B:
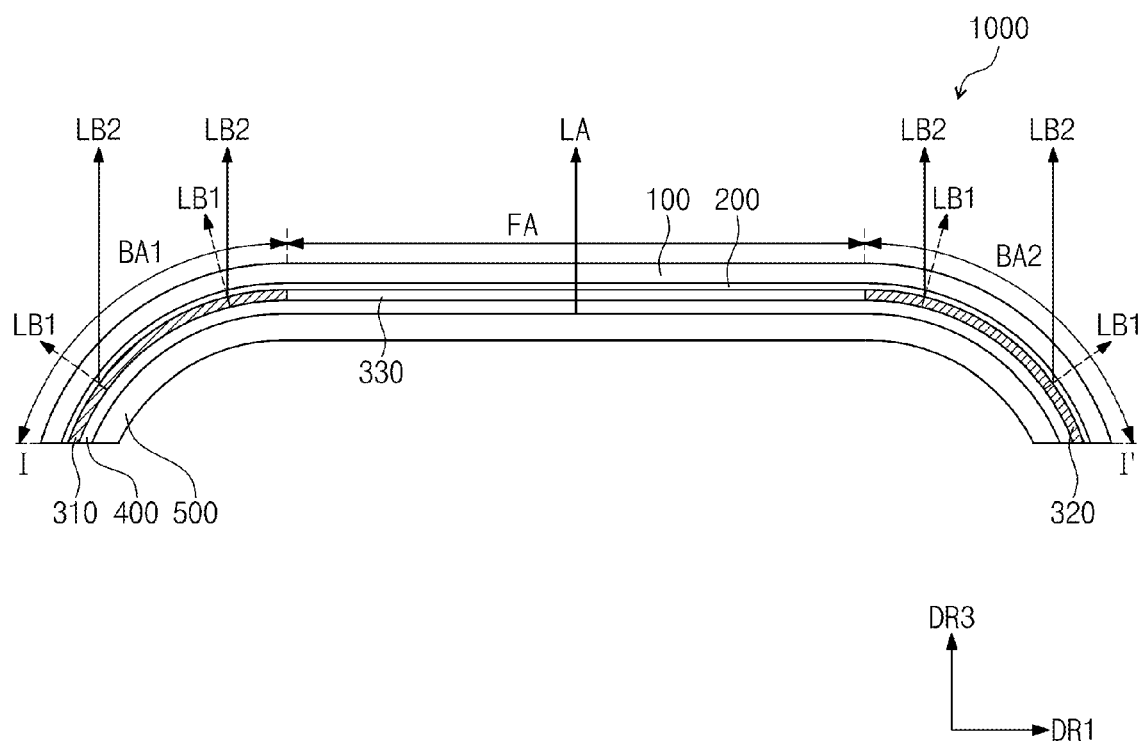
FIG. 2B is a cross-sectional view taken along the line I-I' illustrated in FIG. 1.

FIG. 2A is an exploded perspective view of the display apparatus 1000 illustrated in FIG. 1, and FIG. 2B is a cross-sectional view taken along the line I-I' illustrated in FIG. 1.

Referring to FIGS. 2A and 2B, the display apparatus 1000 according to embodiments of the inventive concept may include a window member 100, a polarizing plate 200, a plurality of optical units 310 and 320, a display panel 400, a cover panel 500, and a case 600.

Each of the window member 100, the polarizing plate 200, the display panel 400, and the cover member 500 may include a flat area and a plurality of curved areas. Each flat area of the window member 100, the polarizing plate 200, the display panel 400, and the cover member 500 overlaps the flat area FA of the display apparatus 1000, and curved areas of each of the window member 100, the polarizing plate 200, the display panel 400, and the cover member 500 respectively overlap the curved areas BA1 and BA2 of the display apparatus 1000.

For convenience of description, the terms "flat area FA" and "curved areas BA1 and BA2" may be used to respectively describe the flat and curved areas of each of the window member 100, the polarizing plate 200, the display panel 400, and the cover member 500. For example, the flat area FA of the display panel 400 may be a flat portion that correspond to the flat area FA of the display apparatus 1000.

The window member 100 may include a light transmission part 100-DA that transmits the image provided from the display panel 400. The window member 100 may be located over the display panel 400. The window member 100 may contain a material including glass, sapphire, plastic, or the like.

The polarizing plate 200 may be under the window member 100. The polarizing plate 200 may function to reduce or suppress reflection of external light, and may function to polarize the light emitted from the display panel 400.

The display apparatus 1000 may further include a touch panel. The touch panel may be located between the window member 100 and the polarizing plate 200. The touch panel may be operated as a resistive type, as a capacitive type, or as a electromagnetic induction type, and may obtain the coordinate information corresponding to a point at which a touch event occurs.

The display panel 400 may be located under the polarizing plate 200. The display panel 400 may include a display area 400-DA and a non-display area 400-NDA that is adjacent the display area 400-DA. The display area 400-DA is an area on which an image is displayed, and may overlap the display area 100-DA of the window member 100. The non-display area 400-NDA may be adjacent the display area 400-DA, and may overlap the non-display area 100-NDA of the window member 100. The display area 400-DA of the display panel 400 may include a flat display area FDA and a plurality of curved display areas BDA.

The display panel 400 may be an organic light emitting display panel. However, the embodiments of the inventive concept are not limited thereto, and according to another embodiment of the inventive concept, the display panel 400 may be realized as a liquid crystal display panel, a plasma display panel, or the like.

The plurality of optical units 310 and 320 may be located between the polarizing plate 200 and the display panel 400. The optical units 310 and 320 may respectively correspond to the curved areas BA1 and BA2 of the display panel 400.

Specifically, the first optical unit 310 may overlap the first curved area BA1, and the second optical unit 320 may overlap the second curved area BA2.

Referring to FIG. 2b, an air layer 330 may be defined in a space surrounded by a portion the display panel 400 corresponding to the flat area FA, the polarizing plate 200, the first optical unit 310 and the second optical unit 320. In another embodiment of the inventive concept, a transparent polymer layer may be filled in the air layer 330.

One portion, or component, of light LA from among lights (e.g., light components) LA and LB1, which may be emitted from the display panel 400, may be provided to the air layer 330, and another portion, or component, of light (e.g., first light) LB1 may be provided to the first and second optical units 310 and 320.

According to embodiments of the inventive concept, the traveling directions of lights LA, LB1, and LB3 (see FIG. 4) may be defined as directions perpendicular to, or normal to, a surface from which the lights LA, LB1, and LB3 are emitted. Also, the traveling direction of lights LA, LB1, LB2, and LB3 may be described as the traveling direction of light components traveling in a specific direction from among many light components included in lights LA, LB1, LB2, and LB3, for convenience of description, although lights LA, LB1, LB2, and LB3 may include light components traveling in other directions.

The first and second optical units 310 and 320 may function to refract the light LB1 emitted from the curved display areas BDA on the curved areas BA1 and BA2 of the display panel 400.

Specifically, light may be emitted from the display panel 400 to the first and second optical units 310 and 320, and to the air layer 330. As a non-limiting example, the light incident to the air layer 330 may be defined as a plane emitted light LA. The plane emitted light LA may be provided to the polarizing plate 200 by passing through the air layer 330, after being incident to the air layer 330, in a direction that is perpendicular to an interface between the display panel 400 and the air layer 330. The direction of the plane emitted light LA may be substantially parallel to the third direction DR3.

The first light LB1 may be refracted by the first and second optical units 310 and 320, and may then reach the polarizing plate 200. When the light refracted by the first and second optical units 310 and 320 is defined as a second light LB2, the direction of the second light LB2 may be approximately parallel to the direction of the plane emitted light LA (e.g., the third direction DR3) through the optical function of (e.g., a refractive index of, a composition of, and/or a shape of) the first and second optical units 310 and 320. More detailed description on the structures and functions of the first and second optical units 310 and 320 will be given below with reference to FIGS. 3A, 3B, 4, 5A, and 5B.

FIGS. 2A and 2B illustrate two optical units 310 and 320, but the embodiments of the inventive concept are not limited to the number of optical units 310 and 320. As a non-limiting example, the display apparatus 1000 may include only one of the first and second optical units 310 and 320. The flat area FA and one of the curved areas BA1 or BA2 between the polarizing plate 200 and the display panel 400 may be filled with a transparent polymer layer.

The cover panel 500 may be attached to a rear surface of the display panel 400. The cover panel 500 may include at least any one of a cushion member, a light blocking member, a heat dissipation member, and a radiation member.

The cushion member may absorb shock exerted to the display apparatus 1000, and may thus reduce or prevent damage to the polarizing plate 200, the optical units 310 and 320, the display panel 400, and the window member 100.

The light blocking member may block external light incident to the display panel 400. The light blocking member may absorb or reflect the incident light.

The heat dissipation member may function to discharge the heat generated from the display panel 400. The heat dissipation member may include graphite molecules.

The radiation member (e.g., a radiation shielding member) may function to shield the display apparatus from electromagnetic interference. Also, the radiation member may function to discharge the heat generated from the display panel 400 together with the heat dissipation member.

The case 600 may be coupled to the window member 100 to accommodate the polarizing plate 200, the optical units 310 and 320, the display panel 400, and the cover panel 500. The case 600 may include plastic or metal. In an embodiment of the inventive concept, the case 600 may be excluded.

Figure 3A:
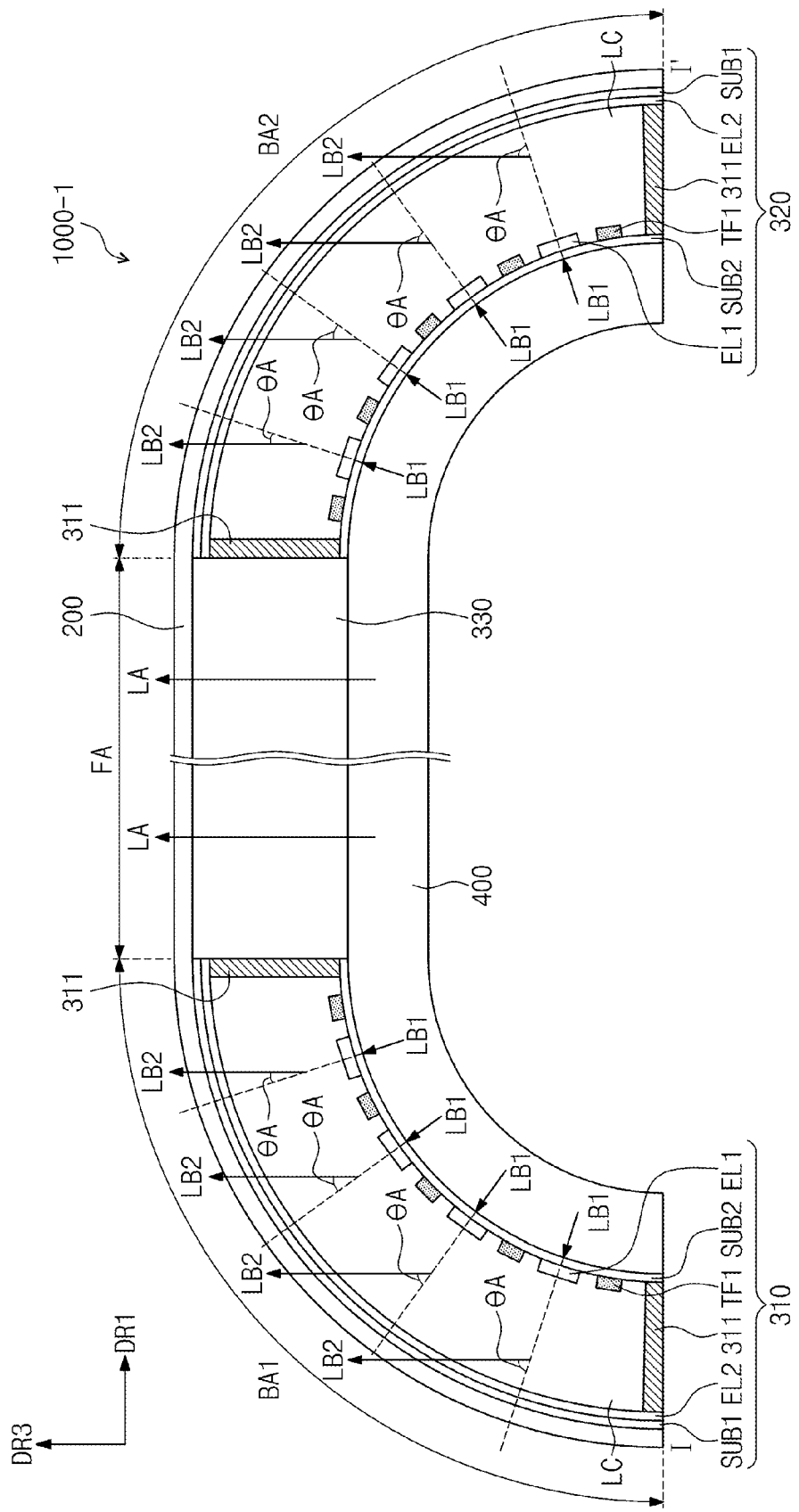
FIG. 3A is a view illustrating first and second optical units of a display apparatus according to an embodiment of the inventive concept.

FIG. 3A is a view illustrating the first and second optical units 310 and 320 of a display apparatus 1000-1 according to an embodiment of the inventive concept. In FIG. 3A, the window member 100, the cover panel 500, and the case 600 are omitted for convenience of description.

Referring to FIG. 3A, the optical units 310 and 320 may include a first substrate SUB1, a second substrate SUB2, and a liquid crystal layer LC interposed between the two substrates SUB1 and SUB2. A barrier rib 311 may be at both side edge regions of each of the first and second curved areas BA1 and BA2.

The first substrate SUB1 may contact a rear surface of the curved areas BA1 and BA2 of the polarization plate 200 to be connected to the polarization plate 200. The second substrate SUB2 may contact a front surface of each of the curved areas BA1 and BA2 of the display panel 400 to be connected to the display panel 400. An adhesion member may be between the first substrate SUB1 and the polarization plate 200, and may be between the second substrate SUB2 and the display panel 400.

An upper electrode EL2 may be provided on the first substrate SUB1. According to an embodiment of the incentive concept, the upper electrode EL2 may be a single layer on an entire surface of the first substrate SUB1. That is, the upper electrode EL2 may have a shape of a single plate. The upper electrode EL2 may be formed of a transparent conductive material, such as indium tin oxide (ITO) or indium zinc oxide (IZO).

A plurality of lower electrodes EL1 may be provided on the second substrate SUB2. The lower electrodes EL1 may be arranged along a curved surface of the first and second curved areas BA1 and BA2. The lower electrodes EL1 are configured to face the upper electrode EL2. The lower electrodes EL1 may be formed of a transparent conductive material, such as indium tin oxide (ITO) or indium zinc oxide (IZO).

The lower electrodes EL1 may be electrically connected to a plurality of first thin film transistors TF1 to be in one-to-one correspondence. Accordingly, each lower electrode EL1 may be individually driven by the first thin film transistor TF1 connected thereto, and voltages different from each other may be applied to all of, or to a portion of, the lower electrodes EL1.

In another embodiment of the inventive concept, a lower electrode group, in which two or more lower electrodes EL1 are grouped together, may be located in plurality on the second substrate SUB2. The plurality of lower electrode groups may be electrically connected to a plurality of first thin film transistors TF1 to be in one-to-one correspondence. In this case, the voltage applied to each of the plurality of lower electrode groups may have an individual value for each lower electrode group, and the lower electrodes EL1 included in one lower electrode group simultaneously receive the same voltage.

The liquid crystal layer LC may include liquid crystal molecules. An electric field may be formed in the liquid crystal layer LC by a voltage applied across the upper electrode EL2 and the plurality of lower electrodes EL1, and the arrangement of the liquid crystal molecules may be controlled by the electric field.

After the first light LB1 is incident to the liquid crystal layer LC from the display panel 400, the incident light LB1 may be refracted by the liquid crystal molecules in the liquid crystal layer LC. When the light traveling toward the polarizing plate 200 after being refracted by the liquid crystal layer LC is defined as a second light LB2, the direction of the second light LB2 may be changed to be adjacent the direction of the plane emitted light LA according to the arranged state of the liquid crystal molecules in the liquid crystal layer LC.

Unlike the embodiments of the inventive concept, when the first light LB1 is inclined with respect to the plate emitted light LA by an inclination angle, a so called white angle difference (WAD) property, in which the colors of the curved areas BA1 and BA2 are distorted in comparison with the flat area FA when the display apparatus is viewed from the front thereof, may be reduced or deteriorated. That is, in case of the display apparatus 1000-1 having the curved areas BA1 and BA2, the brightness and color scattering according to positions in the curved areas BA1 and BA2 may be greater than those in the flat area FA, and the deterioration in brightness and the change in color coordinate may occur according to viewing angles. However, according to the above-mentioned embodiment of the inventive concept, the first and second optical units 310 and 320 may refract the first light LB1 into the second light LB2 by a first angle θA, and the size of the first angle θA may approximately correspond to the size of the inclination angle, and thus the traveling direction of the second light LB2 becomes adjacent the traveling direction of the plate emitted light LA. Thus, according to an embodiment of the inventive concept, the color of the curved areas BA1 and BA2 may be prevented from being viewed as distorted in comparison with flat area FA. As a result, the deterioration in the display quality of the display apparatus 1000-1 due to the WAD property may be reduced or prevented.

The first light LB1 may be incident in a direction perpendicular to, or normal to, a rear surface of the second substrate SUB2. Because the second substrate SUB2 has a curved surface, the direction of the first light LB1 may be different according to positions from which the first light LB1 is incident. More specifically, the first light LB1 may have a plurality of directions in a plane defined by the first direction DR1 and the third direction DR3. Because the second light LB2 is substantially parallel to the plane emitted light LA, the size of an angle between the direction of the first light LB1 and the direction of the plane emitted light LA may be equal to the size of the first angle θA, and the size of the first angle θA may be different according to a position in the curved areas BA1 and BA2 with respect to the first direction DR1.

More specifically, the closer the first light LB1 emitted from the display panel 400 is to an edge of the display apparatus 1000-1 on the second substrate, the greater the size of the first angle θA. That is, the farther the emitted first light LB1 is from the flat area FA, on the curved areas BA1 and BA2, the greater the size of the first angle θA.

Corresponding to the directions in which the first light LB1 is emitted from the second substrate SUB2, the values of voltage applied to the lower electrodes EL1 may sequentially increase for the lower electrodes EL1 toward the edge area of the display apparatus 1000-1 in the first direction DR1. That is, the values of voltage may increase with proximity to the edge area of the display apparatus 1000-1.

Specifically, in the case of the first optical unit 310, the values of voltage applied to the lower electrodes EL1 may sequentially increase in the direction toward the one side of the display apparatus 1000-1 with respect to the first direction DR1. Similarly, in the case of the second optical unit 320, the voltage values applied to the lower electrodes EL1 may sequentially increase toward the other side of the display apparatus 1000-1 with respect to the first direction DR1.

Accordingly, the liquid crystal molecules in the liquid crystal layer LC may refract the first light LB1 by the first angle θA such that the direction of the first light LB1 may be substantially parallel to the plane emitted light LA in a manner corresponding to the strength of the electric field formed between respective ones of the lower electrodes EL1 and the upper electrode EL2. That is, in a sequence in which the lower electrodes EL1 are arranged towards the edge area of the display apparatus 1000-1 in the first direction DR1, the size of the first angle θA by which the first light LB1 is refracted may increase. That is, the closer to the edge of the display apparatus 1000-1, the larger the first angle θA In an embodiment of the inventive concept, the greater the strength of the electric field formed between the respective lower electrodes EL1 and the upper electrode EL2, the greater the first angle θA by which the liquid crystal molecules may refract the first light LB1 into the second light LB2. However, the embodiments of the inventive concept are not limited thereto, and, conversely, according to another embodiment of the inventive concept, the greater the strength of the electric field formed between the lower electrodes EL1 and the upper electrode EL2, the smaller the first angle θA by which the liquid crystal molecules refracts the first light LB1. That is, corresponding to the directions in which the first light LB1 is emitted from the second substrate SUB2, the values of voltage applied to the lower electrodes EL1 may increase in a sequence in which the lower electrodes EL1 are arranged towards the flat area FA (i.e., away from the edge area of the display apparatus 1000-1) in the first direction DR1.

As a result, as the first light LB1 is refracted into the second light LB2 by the first and second optical units 310 and 320, the light emitted from the curved areas BA1 and BA2 may be provided to be substantially in parallel with the plane emitted light LA to the polarizing plate 200. Thus, according to the first embodiment of the inventive concept, the deterioration in brightness, and the change in color coordinate of the display apparatus 1000-1 according to viewing angles, may be reduced or prevented. That is, the deterioration in display quality of the display apparatus 1000-1 may be reduced or prevented.

Figure 3B:
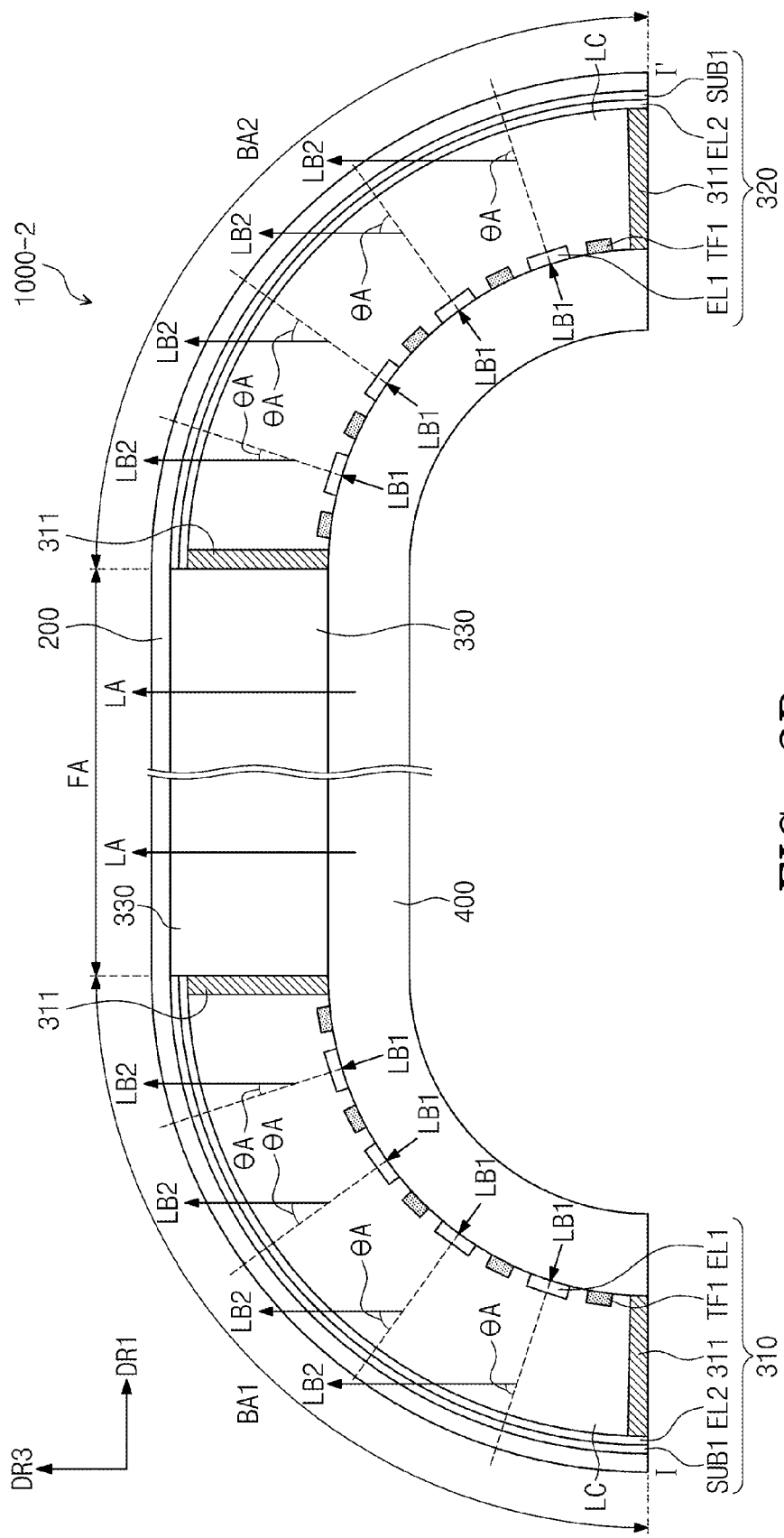
FIG. 3B is a view illustrating first and second optical units of a display apparatus according to another embodiment of the inventive concept.

FIG. 3B is a view illustrating first and second optical units of a display apparatus according to another embodiment of the inventive concept. In describing FIG. 3B, previously described components will be designated by the same reference numerals, and overlapping or repeated descriptions thereof may be omitted.

Referring to FIG. 3B, a display apparatus 1000-2 according to another embodiment of the inventive concept includes first and second optical units 310 and 320, and a second substrate (SUB2 in FIG. 3A) may be omitted in each of the first and second optical units 310 and 320. A plurality of lower electrodes EL1 and a plurality of first thin film transistors TF1 of each of the first and second optical units 310 and 320 may be provided at an upper surface of a display panel 400. As a non-limiting example, the plurality of lower electrodes EL1, and the plurality of first thin film transistors TF1 of each of the first and second optical units 310 and 320, may be provided on an encapsulated substrate of the display panel 400. Thus, according to the present embodiment, the display quality of the display apparatus 1000-2 may be improved, and the thickness of the display apparatus 1000-2 may be reduced.

Figure 4:
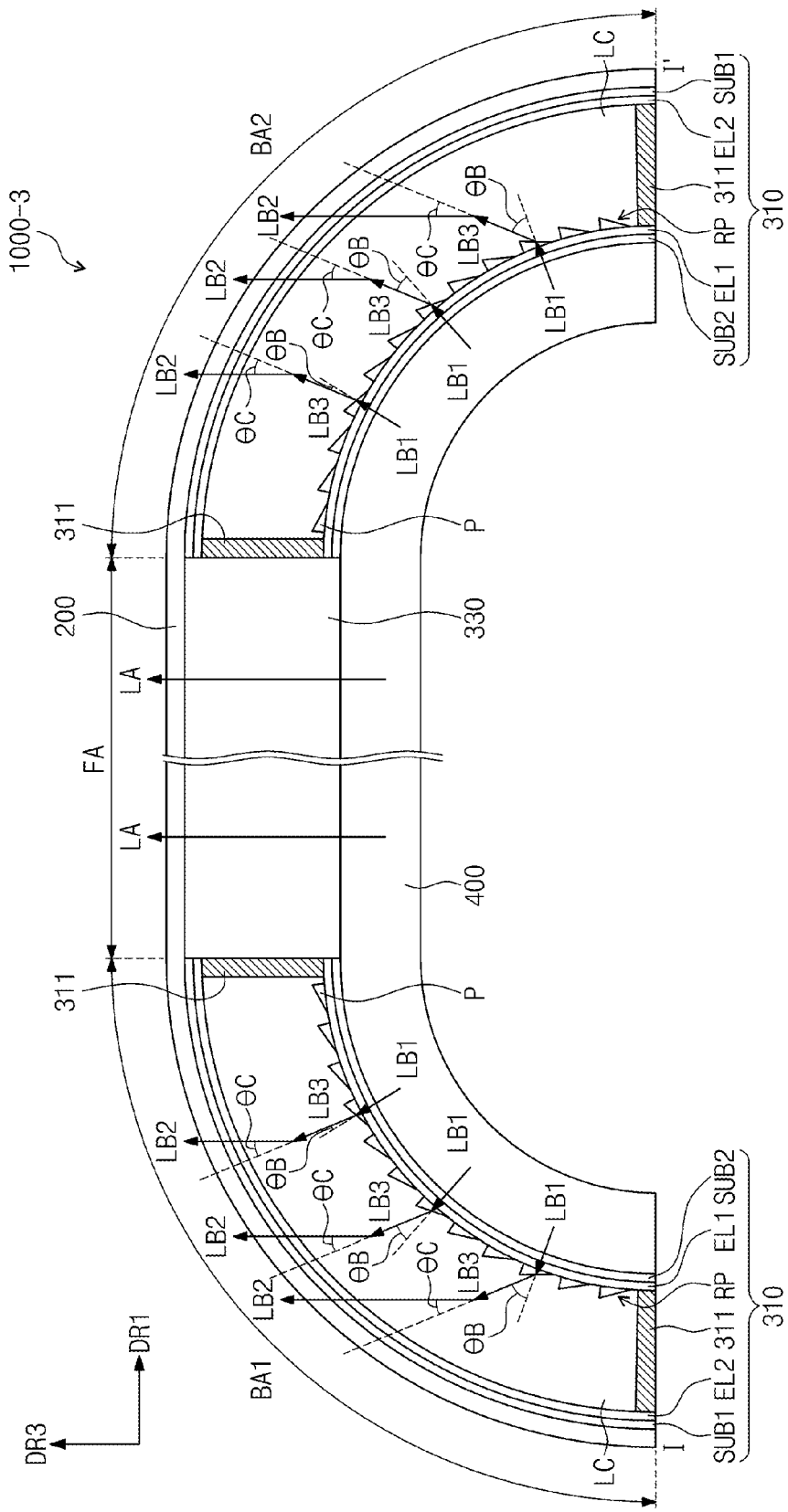
FIG. 4 is a view illustrating first and second optical units of a display apparatus according to a further embodiment of the inventive concept.

FIG. 4 is a view illustrating first and second optical units 310 and 320 of a display apparatus 1000-3 according to another embodiment of the inventive concept. In describing FIG. 4, previously described components will be designated by the same reference numerals, and overlapping descriptions thereof may be omitted.

Referring to FIG. 4, a lower electrode EL1 of each of optical units 310 and 320, according to another embodiment of the inventive concept, may be a single layer on an entire surface of a second substrate SUB2. That is, the lower electrode EL1 may be, or may have a shape of, a single plate. The lower electrode EL1 may have a size corresponding to the size of an upper electrode EL2. The lower electrode EL1 may be facing the upper electrode EL2 with a liquid crystal layer LC therebetween. The lower and upper electrodes EL1 and EL2 may be formed of a transparent conductive material, such as indium tin oxide (ITO) or indium zinc oxide (IZO).

An optical pattern RP may be provided on the lower electrode EL1. The optical pattern RP may include a plurality of prisms P. The plurality of prisms P may be arranged along a curved surface of each of first and second curved areas BA1 and BA2 on the lower electrode EL1.

The optical pattern RP may function to refract first light LB1 incident to the optical units 310 and 320 from the display panel 400 (e.g., in a predetermined direction). The light refracted by the optical pattern RP may be provided to the liquid crystal layer LC, and here, the light may be provided to the liquid crystal layer LC is referred to as third light LB3.

The angle between the direction of the first light LB1 and the direction of the third light LB3 is defined as a second angle θB. That is, the optical pattern RP may refract the direction of the first light LB1 incident to the optical pattern RP from the display panel 400 by the second angle θB.

A second thin film transistor may be adjacent the optical pattern RP. The second thin film transistor may be electrically connected to the lower electrode EL1. Accordingly, a voltage may be applied to the lower electrode EL1 by the second thin film transistor.

In the above-mentioned first and second embodiments, since the plurality of lower electrodes EL1 are driven independently from each other, the plurality of lower electrodes EL1 and the first thin film transistors TF1 are connected to each other in one-to-one correspondence. However, in the third embodiment of the inventive concept, the lower electrode EL1 with a shape of single plate is disposed as a single layer and thus electrically connected to one second thin film transistor (not shown), and a voltage is applied to the lower electrode EL1 by the second thin film transistor.

The liquid crystal layer LC may include liquid crystal molecules. An electric field may be formed in the liquid crystal layer LC by the voltage applied to the lower and upper electrodes EL1 and EL2, and the arrangement of the liquid crystal molecules may be controlled by the electric field.

The liquid crystal molecules of the liquid crystal layer LC may refract the third light LB3 incident to the liquid crystal layer LC from the optical pattern RP to provide the same to a polarizing plate 200. As lights are refracted by the above-mentioned optical pattern RP and the liquid crystal layer LC, the direction of the second light LB2 may be substantially parallel to the direction of a plane emitted light LA.

Figure 5A:
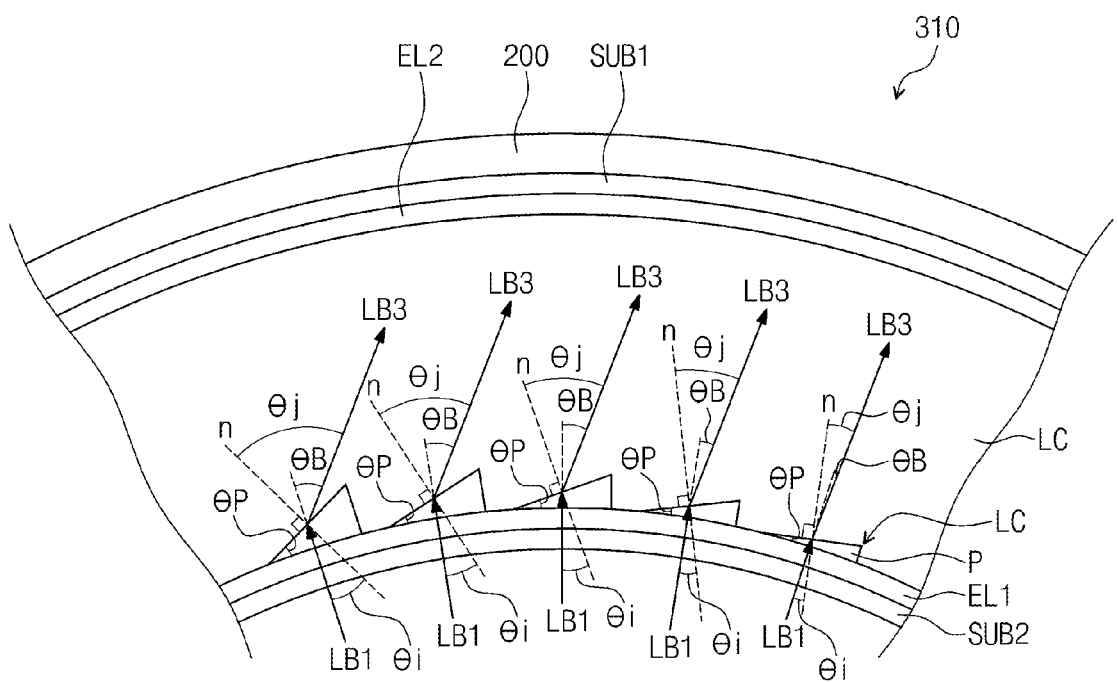
FIG. 5A is an enlarged view of the first optical unit illustrated in FIG. 4.
Figure 5B:
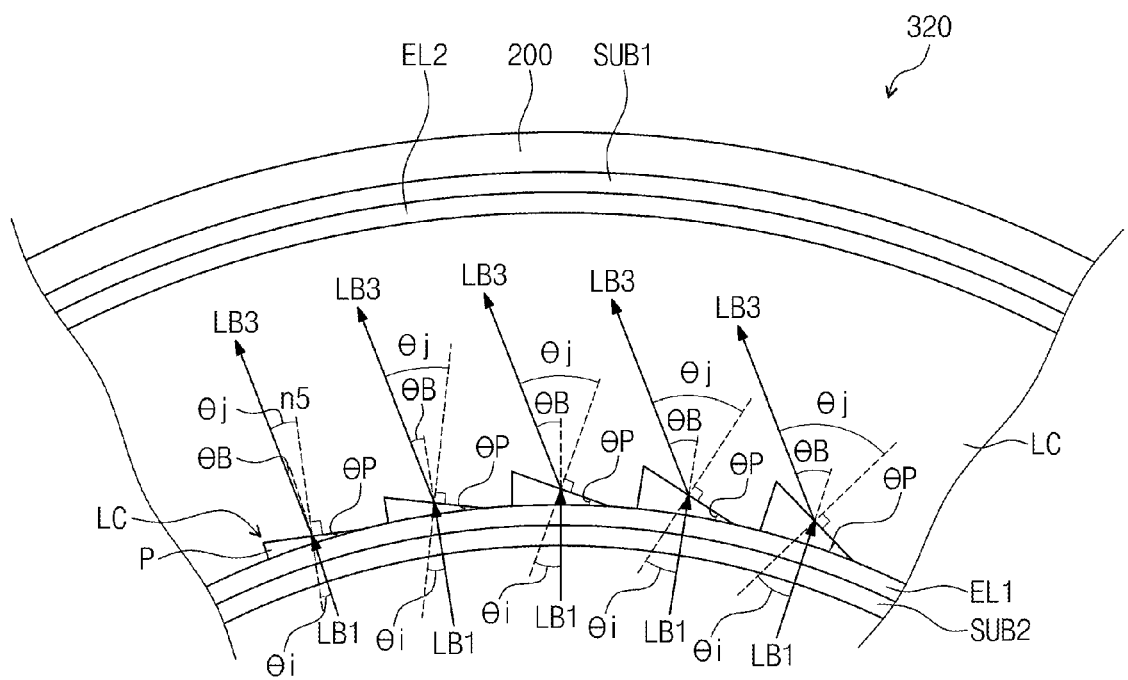
FIG. 5B is an enlarged view of the second optical unit illustrated in FIG. 4.

FIG. 5A is an enlarged view of the first optical unit illustrated in FIG. 4, and FIG. 5B is an enlarged view of the second optical unit illustrated in FIG. 4.

Referring to FIGS. 4, 5A, and 5B, the shape of each of the prisms P in the optical pattern RP may be a right-angled triangle. Specifically, in the first optical unit 310, each of the prisms P may have a shape of a right-angled triangle, which has a hypotenuse inclined toward one side of the display apparatus 1000-3 with respect to the first direction DR1. Also, in the second optical unit 320, each of the prisms P may have a shape of a right-angled triangle, which has a hypotenuse inclined toward the other side of the display apparatus 1000-3 in the first direction DR1.

However, the inventive concepts are not limited thereto. As a non-limiting example, each of the prisms P in the optical pattern RP may have various shapes, such as a triangle other than a right-angled triangle, a semicircle, an ellipse, and a polygon. Also, in another embodiment of the inventive concept, the optical pattern RP may include a plurality of beads.

The prisms P in the optical pattern RP may have shapes that are different from each other. Specifically, the angle between the hypotenuse of a prism P and the side of the prism P contacting the lower electrode EL1 may be defined as an inclination angle θP. The inclination angle θP may sequentially increase in successive prisms P toward an edge area of the display apparatus 1000-3 in the first direction DR1.

Specifically, in the first optical unit 310, the inclination angle θP of each prism P may sequentially increase toward one side of the display apparatus 1000-3, while in the second optical unit 320, the inclination angle θP of each prism P may sequentially increase toward the other side of the display apparatus 1000-3.

The prisms P may function to refract the first light LB1 incident to the prisms P from the display panel 400 into the third light LB3. The size of the inclination angle θP of each prism P may be determined on the basis of Snell's law.

Specifically, the first light LB1 may be incident to the prism P in a direction that is perpendicular to a surface at which each prism P and the low electrode EL1 meet. An angle between the first light LB1 and a normal line n to the hypotenuse of each prism P may be referred to as an incident angle θi, and the angle between the third light LB3, which is emitted to the liquid crystal layer LC after the first light LB1 is refracted by the prism P, and the normal line n may be defined as an exit angle θj. According to another embodiment of the inventive concept, the shape of the prism P may be a right-angled triangle, and the incident angle θi may be equal to the inclination angle θP.

When the liquid crystal layer LC has a first refractive index that is referred to as N1, and when each prism P has a second refractive index that is referred to as N2, the relation between the incident angle θi and the exit angle θj may satisfy the Snell's equation below.

$$N1 \sin \theta i = N2 \sin \theta j$$

The greater the size of the inclination angle θP, the greater the incident angle θi, which is defined by the normal line n and the direction of the first light LB1. Also, according to Snell's law, the greater the incident angle θi, the greater the exit angle θj.

As a result, the greater the inclination angle θP, the greater the second angle θB, which may be defined by the directions of the first light LB1 and the third light LB3. That is, the size of the second angle θB may sequentially increase in the prisms P toward an edge area of the display apparatus 1000-3 in the first direction DR1.

The liquid crystal molecules of the liquid crystal layer LC may refract the third light LB3 by the third angle θC, such that the direction of the third light LB3 incident to the liquid crystal layer LC from each prism P may be substantially parallel to the plane emitted light LA. Here, the angle defined by the direction of the third light LB3 and the direction of the second light LB2 may be defined as a third angle θC. The third angle θC may have a constant value.

Consequently, according to another embodiment of the inventive concept, the first light LB1 may be refracted into the third light LB3 by the optical pattern RP, and the third light LB3 may be refracted into the second light LB2, and thus the light emitted from the curved areas BA1 and BA2 may be provided to the polarizing plate 200 to be substantially in parallel with the plane emitted light LA. Thus, according to another embodiment of the inventive concept, the deterioration in brightness and the change in color coordinate of the display apparatus 1000-3 according to viewing angles may be prevented. That is, the deterioration in display quality of the display apparatus 1000-3 may be reduced or prevented.

Figure 6:
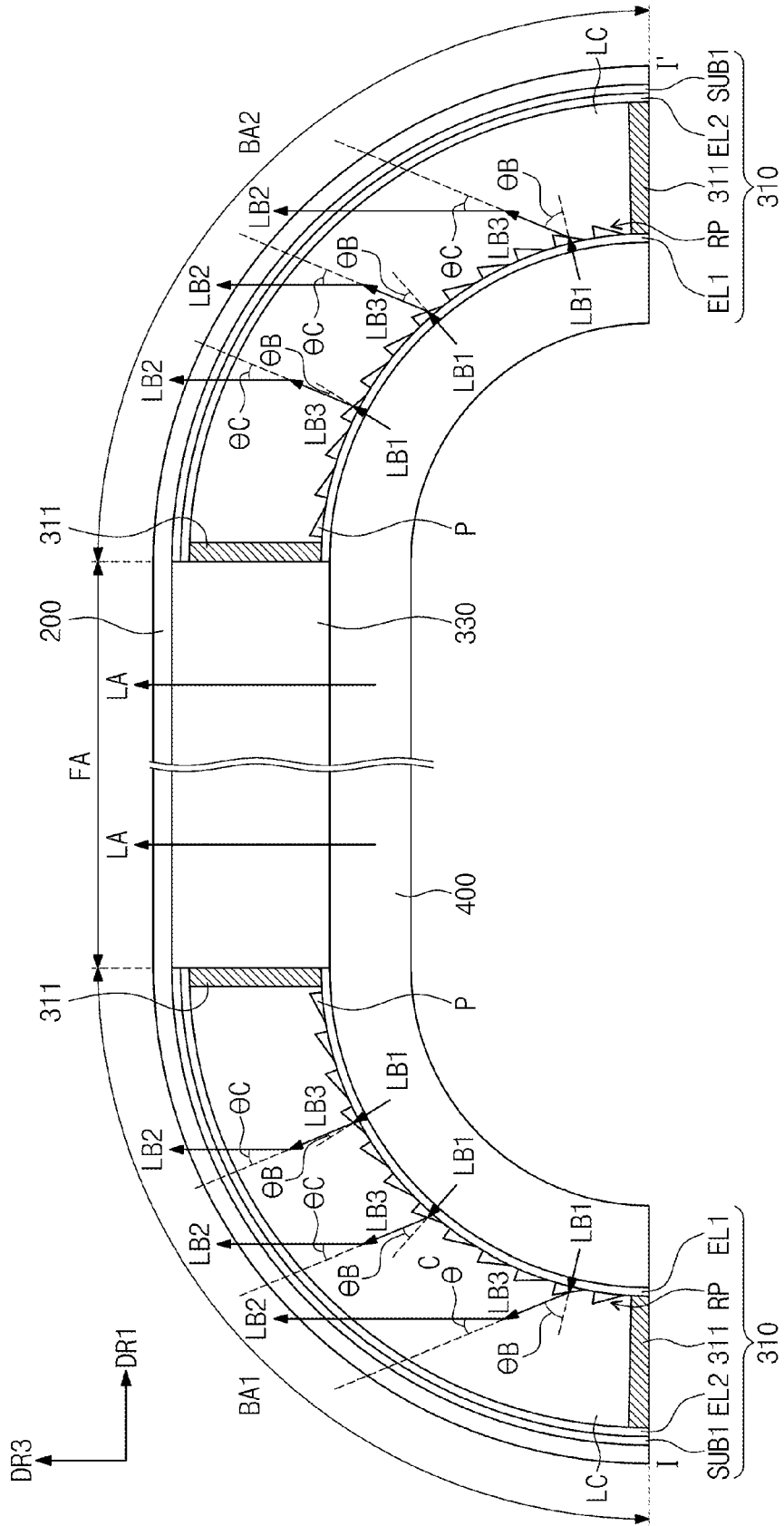
FIG. 6 is a view illustrating first and second optical units of a display apparatus according to an embodiment of the inventive concept.

FIG. 6 is a view illustrating first and second optical units of a display apparatus according to an embodiment of the inventive concept. In describing FIG. 6, previously described components will be designated by the same reference numerals, and overlapping descriptions thereof will not be provided.

Referring to FIG. 6, a display apparatus 1000-4 according to an embodiment of the inventive concept might not be provided with a second substrate SUB2. A lower electrode EL1 and a second thin film transistor TF2 of each of first and second optical units 310 and 320 may be provided on an upper surface of a display panel 400. For example, the lower electrodes EL1 and the second thin film transistors TF2 of each of the first and second optical units 310 and 320 may be provided on an encapsulated substrate of a display panel 400. Thus, according to an embodiment of the inventive concept, the display quality of the display apparatus 1000-4 may be improved, and the thickness of the display apparatus 1000-4 may be reduced.

Figure 7:
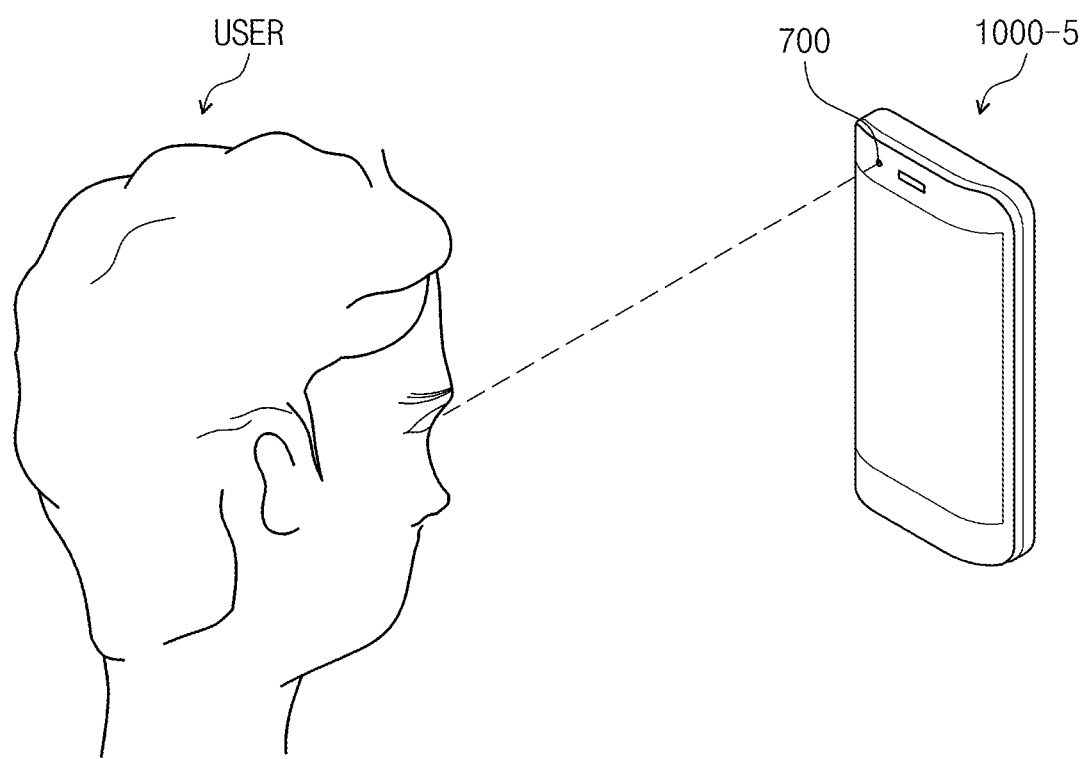
FIG. 7 is a front perspective view of a display apparatus according to another embodiment of the inventive concept.

FIG. 7 is a front view of a display apparatus according to an embodiment of the inventive concept.

Referring to FIG. 7, a display apparatus 1000-5 according to an embodiment of the inventive concept further includes a detection unit 700. The detection unit 700 may include a sensing unit and a control unit.

The sensing unit may measure a viewing angle with which a user USER views the display apparatus 1000-5. As a non-limiting example, the sensing unit may measure the viewing angle by detecting the iris movement of the user USER (e.g., by detecting the user's eyes).

The control unit may control the operation of optical units 310 and 320 on the basis of the data values measured by the sensing unit. According to an embodiment of the inventive concept, because the phenomenon of deterioration in the WAD property occurs when a user USER views the front, the control unit may drive the optical units 310 and 320 on the basis of the data values sensed from the sensing unit when the user views the front.

According to an embodiment of the inventive concept, the deterioration of ward property generated in the curved display area may be prevented. That is, the deterioration in brightness and the change in color coordinate may be prevented. Therefore, according to an embodiment of the inventive concept, the deterioration in display quality of the display apparatus may be reduced or prevented.

Also, according to the above, the thickness of the display apparatus may be reduced.

While embodiments are described above, a person skilled in the art may understand that many modifications and variations may be made without departing from the spirit and scope of the present invention defined in the following claims. Also, embodiments disclosed in the present disclosure are not intended to limit the technical spirit of the present invention and the following claims and all technical spirits falling within equivalent scope are construed as being included in the scope of rights of the present invention and their equivalents.

What is claimed is:

1. A display apparatus comprising:
   a display panel comprising a plurality of curved display areas; and
   a plurality of optical units comprising a liquid crystal layer respectively located on the curved display areas, and configured to adjust a direction of light emitted from the display panel.

2. The display apparatus of claim 1, wherein the optical units further comprise:
   a plurality of lower electrodes at the curved display areas;
   thin film transistors on the display panel, and respectively electrically connected to the lower electrodes;
   a first substrate facing the display panel with the liquid crystal layer therebetween; and
   an upper electrode on the first substrate and facing the lower electrodes.

3. The display apparatus of claim 2, wherein the optical units further comprise a second substrate coupled to the display panel between the first substrate and the display panel,
   wherein the liquid crystal layer is between the first and second substrates, and
   wherein the lower electrodes are on the second substrate.

4. The display apparatus of claim 2, wherein the display panel comprises an organic light emitting display panel.

5. The display apparatus of claim 2, further comprising a window over the optical unit.

6. The display apparatus of claim 5, further comprising a polarizing plate between the optical unit and the window.

7. The display apparatus of claim 1, further comprising a detection unit electrically connected to the optical unit, and configured to detect a user's viewing direction,
   wherein the optical unit is configured to be operated when a viewing direction detected from the detection unit comprises a direction toward a front of the user.

8. The display apparatus of claim 1, further comprising an air gap between the optical units.

9. The display apparatus of claim 8 further comprising a transparent polymer layer in the air gap.

10. The display apparatus of claim 9, wherein the display panel further comprises a flat display area, and wherein the transparent polymer layer overlaps the flat display area of the display panel.

11. A display apparatus comprising:

a display panel comprising a curved display area; and an optical unit comprising:

a liquid crystal layer on the curved display area, and configured to adjust a direction of light emitted from the display panel;

a first substrate facing the display panel;

an upper electrode under the first substrate;

a lower electrode facing the upper electrode with the liquid crystal layer therebetween at the curved display area, and comprising a size corresponding to the upper electrode;

a thin film transistor at the curved display area, and electrically connected to the lower electrode; and an optical pattern on the lower electrode, and configured to guide the direction of the light emitted from the display panel.

12. The display apparatus of claim 11, wherein the optical unit further comprises a second substrate on the display panel and facing the first substrate with the liquid crystal layer therebetween, and wherein the lower electrode is on the second substrate.

13. The display apparatus of claim 12, wherein the optical pattern comprises differently shaped prism parts.

14. The display apparatus of claim 13, wherein each of the prism parts comprises a triangular shape when viewed in a cross-section.

15. The display apparatus of claim 14, wherein the curved display area is at one side of the display panel, wherein each of the prism parts comprises an optical surface inclined toward the one side of the display panel, and wherein a size of an inclination angle between the optical surface and the second substrate increases with proximity of respective ones of the prism parts to the one side of the display panel.

16. The display apparatus of claim 13, wherein each of the prism parts comprises a shape of a right-angled triangle when viewed in a cross-section.

\* \* \* \* \*